US009331116B2

(12) United States Patent
Webster

(10) Patent No.: US 9,331,116 B2
(45) Date of Patent: May 3, 2016

(54) BACK SIDE ILLUMINATED SINGLE PHOTON AVALANCHE DIODE IMAGING SENSOR WITH HIGH SHORT WAVELENGTH DETECTION EFFICIENCY

(71) Applicant: OMNIVISION TECHNOLOGIES, INC., Santa Clara, CA (US)

(72) Inventor: Eric A. G. Webster, Mountain View, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 22 days.

(21) Appl. No.: 14/156,053

(22) Filed: Jan. 15, 2014

(65) Prior Publication Data

US 2015/0200314 A1      Jul. 16, 2015

(51) Int. Cl.
H01L 27/146       (2006.01)

(52) U.S. Cl.
CPC ...... *H01L 27/1464* (2013.01); *H01L 27/14612* (2013.01); *H01L 27/14634* (2013.01); *H01L 27/14636* (2013.01)

(58) Field of Classification Search
CPC ................ H01L 27/144; H01L 27/146; H01L 27/14654; H01L 27/14601; H01L 27/14612; H01L 27/14632; H01L 27/1463; H01L 27/1464; H01L 27/14643
See application file for complete search history.

(56) References Cited

U.S. PATENT DOCUMENTS

| 8,981,516 | B2 * | 3/2015 | Prima et al. ................... 257/447 |
| 2008/0079045 | A1 * | 4/2008 | Bahl et al. ..................... 257/292 |
| 2009/0065831 | A1 * | 3/2009 | Lee ............................... 257/292 |
| 2010/0148039 | A1 * | 6/2010 | Gratz et al. ................ 250/214 R |
| 2010/0225796 | A1 | 9/2010 | Lim et al. |
| 2011/0024768 | A1 * | 2/2011 | Veliadis ........................... 257/77 |
| 2011/0284927 | A1 * | 11/2011 | Achouche ..................... 257/186 |
| 2013/0193546 | A1 | 8/2013 | Webster et al. |
| 2013/0284885 | A1 | 10/2013 | Chen et al. |
| 2014/0054737 | A1 * | 2/2014 | Okino et al. .................. 257/432 |
| 2014/0077385 | A1 * | 3/2014 | Harper .......................... 257/774 |
| 2014/0103196 | A1 * | 4/2014 | Soga et al. ................. 250/208.2 |

FOREIGN PATENT DOCUMENTS

CN          103493202 A        1/2014

OTHER PUBLICATIONS

Taiwanese Patent Application No. 103128343—Taiwanese Office Action and Search Report, Issued Dec. 29, 2015, with English Translation, 16 pages.

* cited by examiner

*Primary Examiner* — Yu Chen
*Assistant Examiner* — Nilufa Rahim
(74) *Attorney, Agent, or Firm* — Blakely Sokoloff Taylor & Zafman LLP

(57) ABSTRACT

A single photon avalanche diode (SPAD) includes an n doped epitaxial layer disposed in a first semiconductor layer. A p doped epitaxial layer is above the n doped epitaxial layer on a back side of the first semiconductor layer. A multiplication junction is defined at an interface between the n doped epitaxial layer and the p doped epitaxial layer. A multiplication junction is reversed biased above a breakdown voltage such that a photon received through the back side of the first semiconductor layer triggers an avalanche multiplication process in the multiplication junction. A p– doped guard ring region is implanted in the n doped epitaxial layer surrounding the multiplication junction.

18 Claims, 5 Drawing Sheets

BACK SIDE ILLUMINATED SINGLE PHOTON AVALANCHE DIODE IMAGING SENSOR WITH HIGH SHORT WAVELENGTH DETECTION EFFICIENCY

BACKGROUND INFORMATION

1. Field of the Disclosure

The present invention relates generally to photodetectors, and more specifically, the present invention is directed to imaging systems including single photon avalanche diode imaging sensors.

2. Background

Image sensors have become ubiquitous. They are widely used in digital still cameras, cellular phones, security cameras, as well as, medical, automobile, and other applications. The technology used to manufacture image sensors, has continued to advance at great pace. For example, the demands of higher resolution and lower power consumption have encouraged the further miniaturization and integration of these image sensors.

One type of photodetector that may be used in an image sensor or in a light detector is a single photon avalanche diode (SPAD). A SPAD (also referred to as a Geiger-mode avalanche photodiode (GM-APD)) is a solid-state photodetector capable of detecting a low intensity signal, such as low as a single photon. SPAD imaging sensors are semiconductor photosensitive devices made up of an array of SPAD regions that are fabricated on a silicon substrate. The SPAD regions produce an output pulse when struck by a photon. The SPAD regions have a p-n junction that is reverse biased above the breakdown voltage such that a single photo-generated carrier can trigger an avalanche multiplication process that causes current at the output of the photon detection cell to reach its final value quickly. This avalanche current continues until a quenching element is used to quench the avalanche process by reducing the bias voltage. The intensity of the photon signal received by the image sensor is obtained by counting the number of these output pulses within a window of time.

Among the challenges faced when sensing photons is achieving high blue detection efficiency with back side illuminated (BSI) SPADs. For instance, in a BSI image sensor, the back surface may include implants that have defects that require laser annealing. These defects can cause a SPAD device fabricated with these techniques not to sustain the required electric fields. In addition, SPAD devices with these defects may be noisy and consequently suffer from poor performance.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
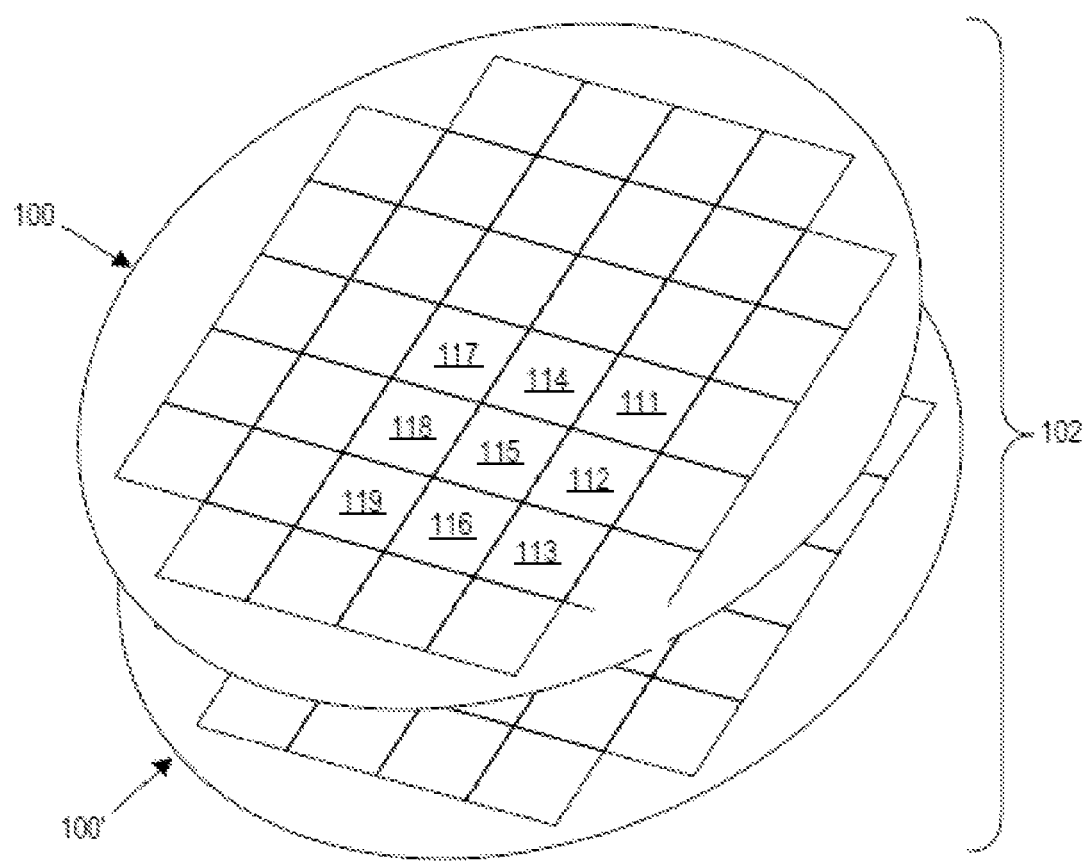
FIG. 1 is an exploded view of one example of stacked semiconductor wafers with integrated circuit dies of an example single photon avalanche diode (SPAD) imaging sensor system in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

As will be discussed, an example single photon avalanche diode (SPAD) imaging sensor system in accordance with the teachings of the present invention includes a SPAD imaging array in which each SPAD is adapted to be illuminated from the back side and includes a thin p epitaxial layer that is formed on the back side over a thicker n epitaxial layer to define the multiplication junction of each SPAD in accordance with the teachings of the present invention. By forming a thin p epitaxial layer over the back side, it is no longer need to form a back side P+ layer by implantation, which can cause implantation damage induced traps in the multiplication junction. The formation of the p epitaxial layer on the back side in accordance with the teachings of the present invention also avoids the use of a laser anneal to try to heal the implant damage, but also results in the junction being deeper. Furthermore, with the formation of the p epitaxial layer on the back side, very low noise is now realized, which improves performance with an example SPAD in accordance with the teachings of the present invention.

To illustrate, FIG. 1 is an exploded view of stacked device wafers 100 and 100' that are to be bonded together to form one example of an integrated circuit system 102 in accordance with the teachings of the present invention. Device wafers 100 and 100' may include silicon, gallium arsenide, or other suitable semiconductor materials. In the illustrated example, device wafer 100 includes semiconductor dies 111-119 while device wafer 100' includes corresponding semiconductor dies (view obscured in FIG. 1). As will be discussed in more detail below, in some examples, each die 111-119 of device wafer 100 may include an array of back side illuminated SPADs including a thin p epitaxial layer formed on the back side over a thicker n epitaxial layer to define the multiplication junction, while each corresponding die of device wafer 100' with CMOS circuitry including for example an array of digital counters and associated read-out electronics that are fabricated using standard CMOS processes. The placement of digital counters on the separate bottom device wafer 100' allows for a very high fill factor in the SPAD array on the top device wafer 100. Furthermore, since device wafer 100 is formed separately from device wafer 100', custom fabrication processes may be utilized to optimize the formation of the SPAD regions in the SPAD array on device wafer 100, while traditional CMOS processes may be retained when forming the CMOS circuitry on the device wafer 100' in accordance with the teachings of the present invention.

Figure 2:
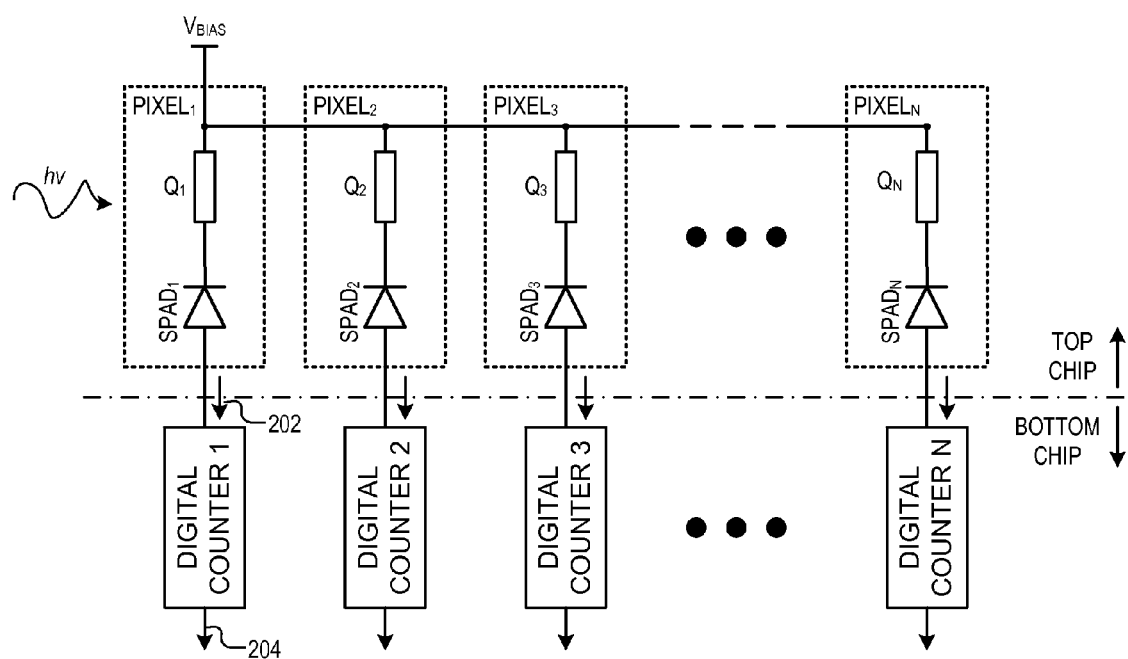
FIG. 2 is a circuit diagram illustrating one example of a stacked chip SPAD imaging sensor system including quenching elements in accordance with the teachings of the present invention.

FIG. 2 is a circuit diagram illustrating one example of a stacked SPAD imaging sensor system including quenching elements in accordance with the teachings of the present invention. It is noted that the pixel circuitry illustrated in FIG. 2 (e.g., $PIXEL_1$, $PIXEL_2$, . . . $PIXEL_N$) is one possible example of a SPAD pixel circuitry architecture for implementing each pixel with an imaging array. In the example depicted in FIG. 2, pixels $PIXEL_1$ through $PIXEL_N$ are illustrated as being arranged in a single row. However, in other examples, it is appreciated that pixels of an imaging array may be arranged into a single column, or into a two-dimensional array of columns and rows.

As shown in the example, each example pixel includes a SPAD (e.g., $SPAD_1$-$SPAD_N$) coupled to a respective quenching element (e.g., quenching elements $Q_1$-$Q_N$) disposed in a top chip of a stacked chip system. In the illustrated example, it is noted that each SPAD includes thin p epitaxial layer that is formed on the back side over a thicker n epitaxial layer to design the multiplication junction in accordance with the teachings of the present invention. In various examples, it is also noted that the example quenching elements $Q_1$-$Q_N$ that are coupled to each respective $SPAD_1$-$SPAD_N$ may be included in the top chip or the bottom chips in accordance with the teachings of the present invention. It is also appreciated that example quenching elements $Q_1$-$Q_N$ may be implemented using passive or active quenching elements in accordance with the teachings of the present invention.

As shown in the example, there are N number of SPADs, N number of quenching elements, and N number of digital counters (e.g., Digital Counters 1-N). In the depicted example, the digital counters 1-N are implemented using CMOS circuitry disposed on a bottom chip fabricated using a standard CMOS process of the stacked chip system, and are electrically coupled to receive output pulses 202 generated by a respective SPAD in response to a received photon. The digital counters 1-N may be enabled to count the number of output pulses 202 generated by each respective SPAD during a window of time and to output a digital signal 204 that is representative of the count. Although the example depicted in FIG. 2 illustrates a direct connection between the pixel circuitry and the digital counter, any connection between pixel circuitry and the digital counter, including by way of AC coupling, may be utilized in accordance with the present teachings. Furthermore, any known SPAD bias polarity and/or orientation may be implemented. In one example, each digital counter includes an amplifier to amplify the received output pulse 202. Alternately, or in addition to digital counters, timing circuitry can be placed in each pixel/column/array to time the arrival of incident photons.

In operation, each $SPAD_1$-$SPAD_N$ is reverse biased via a bias voltage $V_{BIAS}$ that is above the breakdown voltage of each $SPAD_1$-$SPAD_N$. In response to a single photogenerated carrier, an avalanche multiplication process is triggered that causes an avalanche current at the output of each $SPAD_1$-$SPAD_N$. This avalanche current self-quenches in response to a voltage drop that is developed across the quenching element (e.g., $Q_1$-$Q_N$), which causes the bias voltage across the SPAD to drop. After the quenching of the avalanche current, the voltage across the SPAD recovers to above the bias voltage and then the SPAD is ready to be triggered again. The resulting output pulse 202 of each $SPAD_1$-$SPAD_N$ is received by a respective digital counter 1–N, which increments its count in response thereto.

Conventional SPAD designs that incorporate SPADs on the same chips as the CMOS digital counters fabricated using a standard CMOS process suffer from reduced fill factor on the imaging plane due to the area occupied by the CMOS circuits themselves. Accordingly, one advantage of implementing a stacked chip structure in accordance with the teachings of the present invention is that with the SPADs on the top chip and with the CMOS circuitry on a separate bottom chip, the fill factor of the SPAD imaging array on the top chip does not need to be reduced in order to provide room to accommodate the CMOS circuitry on the same chip in accordance with the teachings of the present invention.

It is noted that the circuit diagram of FIG. 2 is provided herewith for explanation purposes and that some circuit elements (e.g., passive components such as resistors and capacitors, and active components such as transistors) are not shown in detail so as not to obscure the teachings of the present invention. For example, the illustrated pixel circuitry of FIG. 2 may produce an output pulse that requires amplification prior to being sensed by the input of the digital counters. In another example, the connection at the node between quenching element $Q_1$ and $SPAD_1$ would be at a high voltage, which may require AC coupling.

Figure 3A:
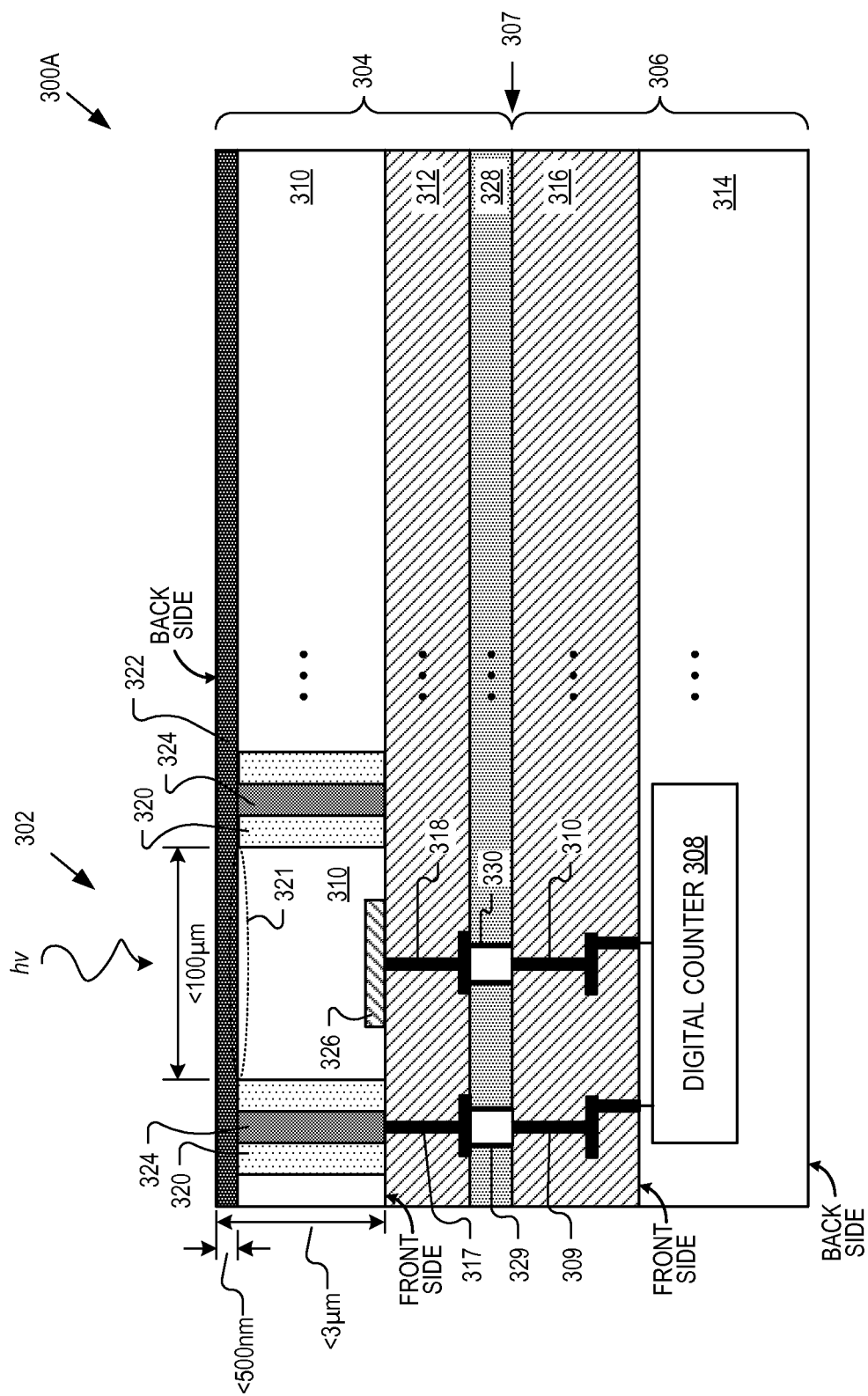
FIG. 3A is a cross-sectional view of one example of an integrated circuit system including a SPAD imaging sensor system with stacked device wafers in accordance with the teachings of the present invention.

FIG. 3A is a cross-sectional view of a portion of one example of an integrated circuit system 300A including a SPAD imaging sensor system with stacked device wafers in accordance with the teachings of the present invention. Integrated circuit system 300A is one possible implementation of a portion of the example integrated circuit systems illustrated above in FIGS. 1-2. The illustrated example of integrated circuit system 300A shown in FIG. 3A includes a first device wafer 304, a second device wafer 306, and a bonding interface 307 at which first device wafer 304 is bonded to second device wafer 306. The first device wafer 304 includes a first semiconductor layer 310 and a first interconnect layer 312, while the second device wafer 306 is shown as including a second semiconductor layer 314 and a second interconnect layer 316. In the example, semiconductor layer 310 is shown as including a SPAD imaging array including a SPAD region 302, which is one of a plurality of SPAD regions formed in semiconductor layer 310 in accordance with the teachings of the present invention. In the various examples, each one of the plurality of SPAD regions of the SPAD imaging array formed in the semiconductor layer 310 are substantially similar to SPAD region 302, but is not illustrated in detail so as not to obscure the teachings of the present invention. In one example, the SPAD imaging array, including SPAD region 302, is adapted to be illuminated from the back side, is formed near a front side of semiconductor layer 310, and may be arranged into a plurality of rows and columns in accordance with the teachings of the present invention.

In the depicted example, second device wafer 306 is a CMOS logic chip that is fabricated using a standard CMOS process and includes semiconductor layer 314, which is shown as including digital counter 308, which is one of a digital counters formed in semiconductor layer 314 in accordance with the teachings of the present invention. In the various examples, each one of the plurality of digital counters formed in the semiconductor layer 314 is substantially similar to digital counter 308, but is not illustrated in detail so as not to obscure the teachings of the present invention. In the example, each digital counter is formed near a front side of the semiconductor layer 314 and is coupled to a respective SPAD region. For instance, as shown in the depicted example, digital counter 308 is coupled to respective SPAD region 302 by way of metal traces 309, 310, 317, and 318, and vias 329 and 330. In other words, each SPAD region is coupled to its own respective CMOS circuit (e.g., SPAD region 302 is coupled to its own CMOS circuit, digital counter 308) in the depicted example. In one example, other circuitry may be formed in second semiconductor layer 314 and coupled to a respective SPAD region via metal traces. Digital or analog circuitry such as timing circuitry may be used for applications such as time of flight.

In one example, vias 329 and 330 are micro-through silicon vias (μTSVs) disposed in an oxide layer 328. In one example, metal traces 309, 310, 317, and 318 may include a redistribution layer (RDL) comprising a thin-film (e.g., aluminum, copper, etc.) for rerouting and redistributing electrical connections between each one of the plurality of SPAD regions (e.g., SPAD region 302) and the respective one of the plurality of digital counters (e.g., digital counter 308). In one example, μTSVs 329 and 330 may include a conductive material (e.g., copper, poly-silicon, etc.) deposited therein.

In one example, semiconductor layer 310 and semiconductor layer 314 may include layers of epitaxially grown silicon. In one example, semiconductor layer 310 is n doped epitaxially grown silicon. As shown in the example depicted in FIG. 3A, SPAD region 302 includes a thin p doped epitaxial layer 322 formed over back side of a thicker n doped epitaxial layer of the first semiconductor layer 310 in accordance with the teachings of the present invention. In one example, the p doped epitaxial layer 322 has a thickness of less than approximately 500 nm, and the thicker n doped epitxially grown silicon layer of first semiconductor layer 310 has a thickness of less than approximately 3 μm.

As shown in the example, a multiplication junction 321 is defined at the pn junction defined at the interface between the n doped epitaxial layer 310 and the p doped epitaxial layer 322. In one example, the SPAD multiplication junction 321 is less than approximately 100 nm wide and has doping profile that can be very well controlled by the epitaxial layer doping profiles. For instance, in one example, the p doped epitaxial layer 322 has a graded doping profile in order to optimize SPAD performance in accordance with the teachings of the present invention. In one example, multiplication junction 321 is reversed biased above a breakdown voltage such that a photon received through the back side of the first semiconductor layer 310 triggers an avalanche multiplication process in the multiplication junction 321 in accordance with the teachings of the present invention.

As shown in the example depicted in FIG. 3A, a p– doped guard ring region 320 is implanted in the n doped epitaxial layer 310 surrounding the multiplication junction 321 to provide isolation for SPAD 302 in accordance with the teachings of the present invention. As shown in the example, a p+ doped contact region 324 is implanted within the p– doped guard ring region 320. In the example, the p+ doped contact region 324 has a higher doping concentration than the p– doped guard ring region 320. As such, the p+ doped contact region 324 is coupled to provide contact to the p doped epitaxial layer 322 from a front side of the first semiconductor layer 310, to for example digital counter 308 through metal trace 317, via 329, and metal trace 309, while guard ring region 320 provides isolation in accordance with the teachings of the present invention.

In the example, an n+ doped contact region 326 is disposed in the n doped epitaxial layer on the front side of first semiconductor layer 310 as shown. As such, the n+ doped contact region 326 is coupled to provide contact to the n doped epitaxial layer of first semiconductor layer 310 from the front side of the first semiconductor layer 310, to for example digital counter 308 through metal trace 319, via 330, and metal trace 310 in accordance with the teachings of the present invention.

As illustrated in the depicted example of FIG. 3A, the multiplication junction 321 between the n doped epitaxial layer 310 and the p doped epitaxial layer 322 is adapted to be illuminated with photons through the back side of first semiconductor layer 310 in accordance with the teachings of the present invention. In the example, the shallow p doped epitaxial layer 322 on the back side of first semiconductor layer 310 provides improved high blue sensitivity while maintaining good junction characteristics and low noise in accordance with the teachings of the present invention. In another example, the polarity of the doped regions of integrated circuit system 300A may be reversed. For example, epi layer 310 and contact region 326 may be p doped and p+ doped, respectively, and guard ring 320, epi layer 322, and contact region 324 may be n doped, n doped, and n+ doped, respectively.

Figure 3B:
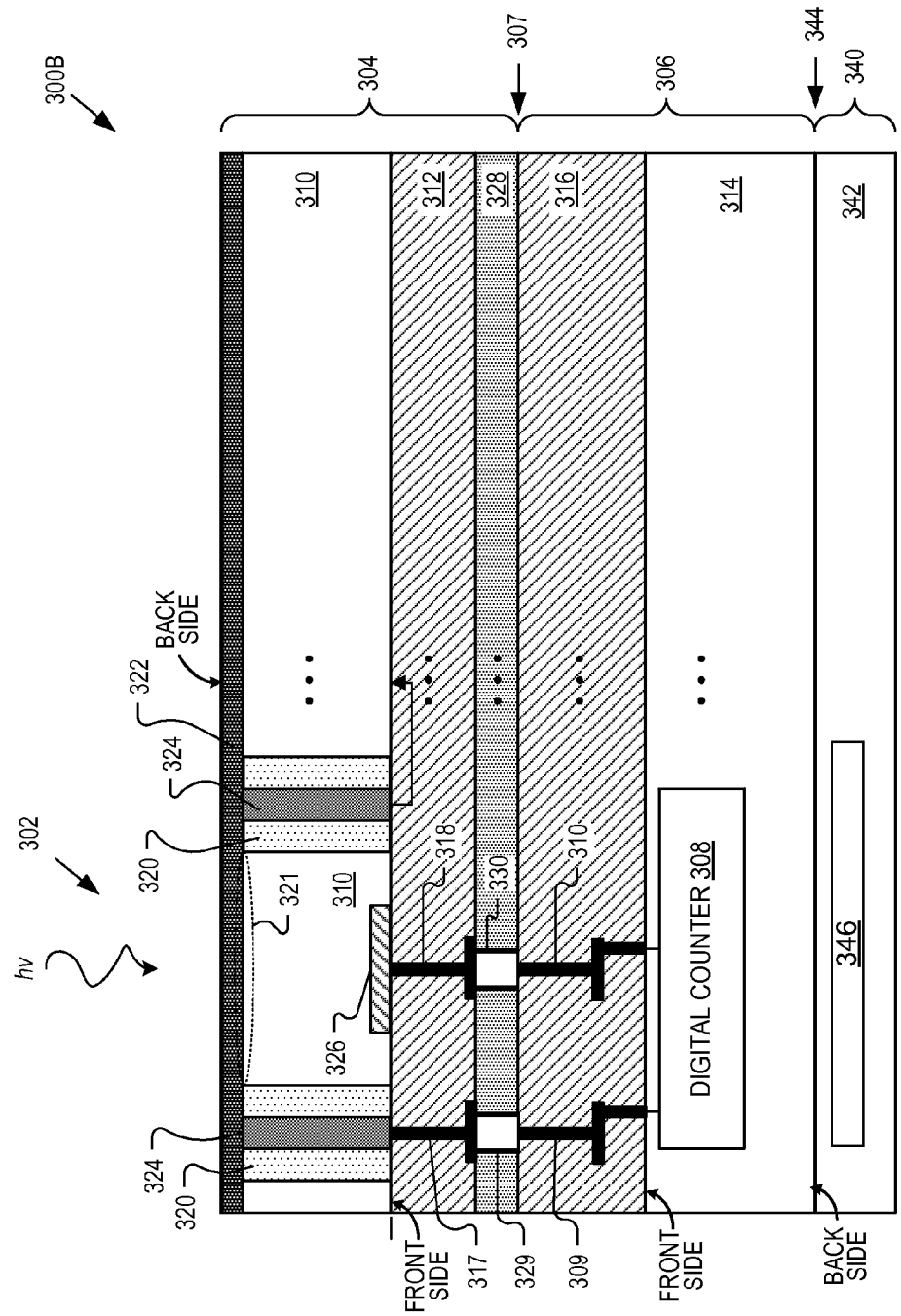
FIG. 3B is a cross-sectional view of one example of an integrated circuit system including a SPAD imaging sensor system with three stacked device wafers in accordance with the teachings of the present invention.

FIG. 3B is a cross-sectional view of an integrated circuit system 300B having stacked device wafers 304, 306, and 340, in accordance with an embodiment of the invention. Integrated circuit system 300B is one possible implementation of a portion of integrated circuit system 102 of FIG. 1. The illustrated example of integrated circuit system 300B includes first device wafer 304, second device wafer 306, third device wafer 340 and bonding interfaces 307 and 344. First device wafer 304 and second device wafer 306 bond and operate as discussed above. However, integrated circuit system 300B includes an additional third wafer 340 bonded to the second device wafer 306. As shown, third wafer 340 includes a third semiconductor layer 342 and semiconductor device 346 formed in or on the third device wafer 340. In one example, device 346 includes a storage device, such as random access memory (RAM), to act as a frame store to enable high-speed burst imaging capability. In this example, device 346 may be coupled to receive and store the outputs of the digital counters included in second semiconductor layer 314.

Figure 4:
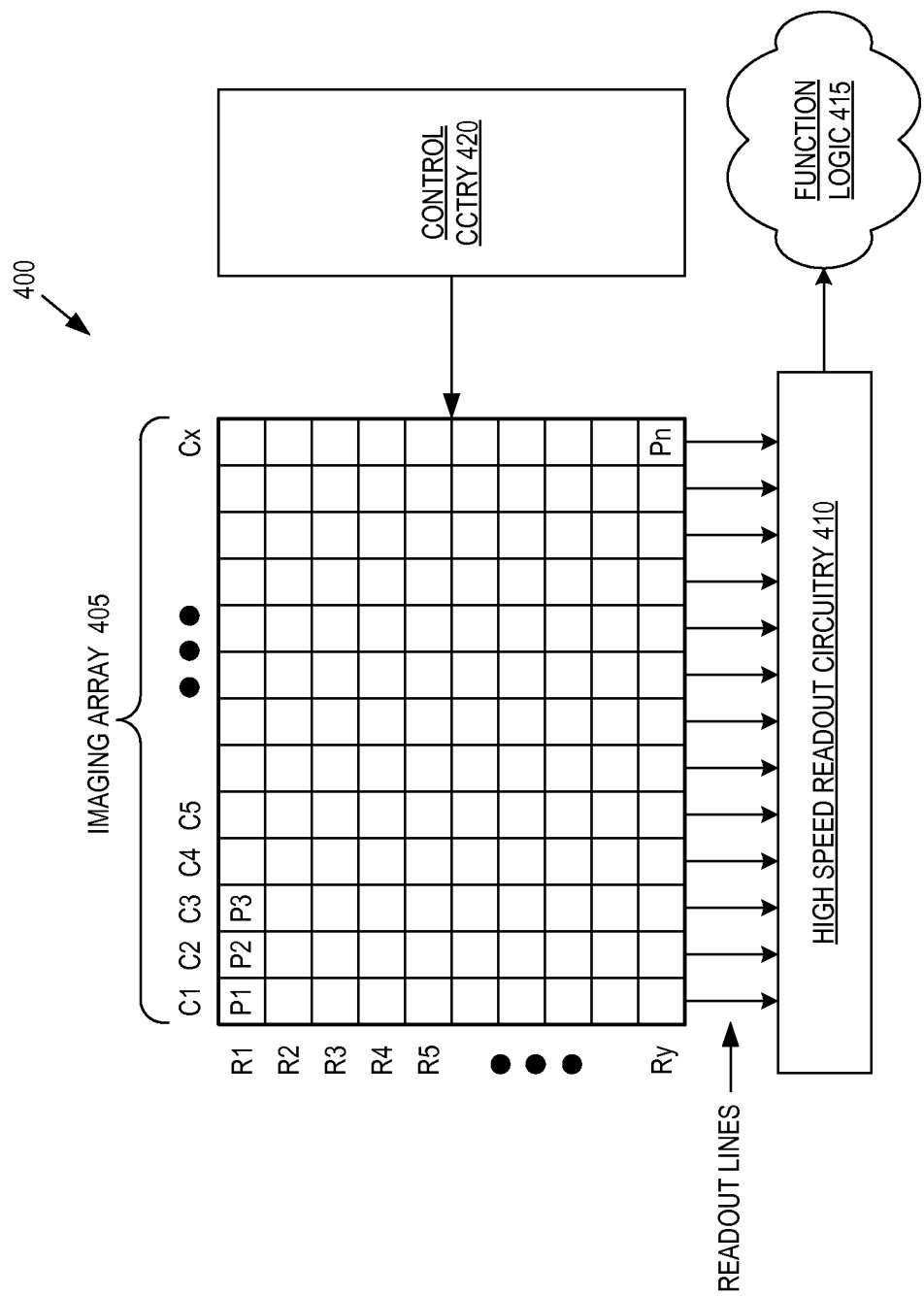
FIG. 4 is a block diagram showing one example of an integrated circuit system having an example SPAD imaging sensor system in accordance with the teachings of the present invention.

FIG. 4 is a block diagram showing one example of an integrated circuit system having an example SPAD imaging sensor system 400 in accordance with the teachings of the present invention. SPAD imaging sensor system 400 may be one example implementation of the portions of the example stacked integrated circuit systems illustrated above in FIGS. 1-3. The illustrated embodiment of SPAD imaging sensor system 400 shown in FIG. 4 includes a SPAD imaging array 405, high speed readout circuitry 410, function logic 415, and control circuitry 420.

As shown in the depicted example, imaging array 405 is a two-dimensional ("2D") array of backside illuminated imaging sensors or pixels (e.g., pixels P1, P2 . . . , Pn). In one example, each pixel includes a SPAD region that is adapted to be illuminated from the back side and includes a thin p epitaxial layer that is formed on the back side over a thicker n epitaxial layer to define the multiplication junction of each SPAD region in accordance with the teachings of the present invention. As illustrated in the depicted example, each pixel is arranged into a row (e.g., rows R1 to Ry) and a column (e.g., column C1 to Cx) to acquire image data of a person, place, or object, which can then be used to render a 2D image of the person, place, or object. Imaging array 405 may also be used in timing mode to give a "time image" of a scene, which may be used in time of flight applications for range information or fluorescence lifetime for medical applications.

Output pulses generated by the SPAD regions of imaging array 405 are read out by high speed readout circuitry 410 and transferred to function logic 415. Readout circuitry 410 includes at least one digital counter for each of the SPAD regions and can also include amplification circuitry and/or quenching circuitry. Function logic 415 can simply store image data in memory or even manipulate the image data by applying post image effects (e.g., crop, rotate, remove red eye, adjust brightness, adjust contrast, or otherwise). Control circuitry 420 is coupled to imaging array 405 and/or to readout circuitry 410 to control operational characteristics of imaging array 405. For example, control circuitry 420 may simultaneously enable each of the digital counters included in high speed readout circuitry 410 for a window of time so as to implement a global shutter operation. Accordingly, embodiments of the SPAD stacked chip image sensor, discussed herein, provide for imaging that is both high speed and low light sensitive, which is typically not achieved with conventional sensor architectures.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A single photon avalanche diode (SPAD), comprising:
   an n doped epitaxial layer disposed in a first semiconductor layer;
   a p doped epitaxial layer formed over the n doped epitaxial layer on a back side of the first semiconductor layer, wherein the p doped epitaxial layer covers the entire back side of the first semiconductor layer;
   a multiplication junction defined at an interface between the n doped epitaxial layer and the p doped epitaxial layer, wherein a multiplication junction is reversed biased above a breakdown voltage such that a photon received through the back side of the first semiconductor layer triggers an avalanche multiplication process in the multiplication junction; and
   a p− doped guard ring region implanted in the n doped epitaxial layer surrounding the multiplication junction, wherein the p doped epitaxial layer covers the entire p− doped guard ring from the back side of the first semiconductor layer.

2. The SPAD of claim 1 further comprising an n+ doped contact region disposed in the n doped epitaxial layer, wherein the n+ doped contact region is coupled to provide contact to the n doped epitaxial layer from a front side of the first semiconductor layer.

3. The SPAD of claim 1 further comprising a p+ doped contact region implanted within the p− doped guard ring region, wherein the p+ doped contact region is coupled to provide contact to the p doped epitaxial layer from a front side of the first semiconductor layer.

4. The SPAD of claim 3 wherein the p+ doped contact region has a higher doping concentration than the p− doped guard ring region.

5. The SPAD of claim 1 wherein the p doped epitaxial layer has a graded doping profile.

6. An imaging sensor system, comprising:
   a first semiconductor layer of a first wafer;
   a single photon avalanche diode (SPAD) imaging array including a plurality of pixels formed in the first semiconductor layer, wherein each pixel includes a SPAD including:
      an n doped epitaxial layer disposed in the first semiconductor layer;
      a p doped epitaxial layer formed over the n doped epitaxial layer on a back side of the first semiconductor layer, wherein the p doped epitaxial layer covers the entire back side of the first semiconductor layer;
      a multiplication junction defined at an interface between the n doped epitaxial layer and the p doped epitaxial layer, wherein a multiplication junction is reversed biased above a breakdown voltage such that a photon received through the back side of the first semiconductor layer triggers an avalanche multiplication process in the multiplication junction;
      a p− doped guard ring region implanted in the n doped epitaxial layer surrounding the multiplication junction, wherein the p doped epitaxial layer covers the entire p− doped guard ring from the back side of the first semiconductor layer;
   a second semiconductor layer of a second wafer bonded to the first wafer;
   a plurality of digital counters formed in the second semiconductor layer and electrically coupled to the SPAD imaging array, wherein each one of the plurality of digital counters is coupled to count output pulses generated by a respective one of the plurality of pixels.

7. The imaging sensor system of claim 6 wherein each SPAD further includes an n+ doped contact region disposed in the n doped epitaxial layer, wherein the n+ doped contact region is coupled to provide contact to the n doped epitaxial layer from a front side of the first semiconductor layer.

8. The imaging sensor system of claim 6 wherein each SPAD further includes a p+ doped contact region implanted within the p− doped guard ring region, wherein the p+ doped contact region is coupled to provide contact to the p doped epitaxial layer from a front side of the first semiconductor layer.

9. The imaging sensor system of claim 8 wherein the p+ doped contact region has a higher doping concentration than the p– doped guard ring region.

10. The imaging sensor system of claim 6 wherein the p doped epitaxial layer has a graded doping profile.

11. The imaging sensor system of claim 6 wherein each of the plurality of digital counters formed in the second semiconductor layer comprises a complementary metal oxide semiconductor (CMOS) circuit disposed in the second semiconductor layer of the second wafer.

12. The imaging sensor system of claim 6 wherein the plurality of pixels include an N number of pixels, wherein the plurality of digital counters includes at least N number of digital counters, and wherein each of the N number of digital counters is coupled to a respective one of the plurality of pixels.

13. The imaging sensor system of claim 6 further comprising:
    a first interconnect layer disposed on the front side of the first semiconductor layer; and
    a second interconnect layer disposed on the second semiconductor layer, wherein the first wafer is bonded to the second wafer at a bonding interface between the first interconnect layer and the second interconnect layer.

14. The imaging sensor system of claim 13 wherein the first interconnect layer includes a first oxide, the second interconnect layer includes a second oxide, and wherein the bonding interface includes an interface between the first oxide and the second oxide.

15. The imaging sensor system of claim 14 wherein the first interconnect layer comprises a plurality of vias, wherein each one of the plurality of vias is coupled to a respective pixel of the SPAD imaging array to transfer the output pulses to the second interconnect layer at the bonding interface.

16. The imaging sensor system of claim 6, wherein each pixel comprises a quenching element coupled to a respective SPAD to quench avalanching of the respective SPAD by lowering a bias voltage.

17. The imaging sensor system of claim 6 further comprising control circuitry formed in the second semiconductor layer and coupled to the SPAD imaging array to control operation of the SPAD imaging array.

18. The imaging sensor system of claim 17 further comprising function logic formed in the second semiconductor layer and coupled to the plurality of digital counters to store data read out from the SPAD imaging array.

* * * * *